(12) United States Patent
Ju et al.

(10) Patent No.: US 10,192,475 B2
(45) Date of Patent: Jan. 29, 2019

(54) DISPLAY DEVICE CAPABLE OF CONTROLLING VIEWING ANGLE AND METHOD FOR DRIVING THE SAME

(71) Applicant: LG DISPLAY CO., LTD., Seoul (KR)

(72) Inventors: SeongHwan Ju, Paju-si (KR); HyeonHo Son, Goyang-si (KR); SeungChul Lee, Goyang-si (KR); SungMin Jung, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/799,260

(22) Filed: Oct. 31, 2017

(65) Prior Publication Data
US 2018/0122292 A1 May 3, 2018

(30) Foreign Application Priority Data
Oct. 31, 2016 (KR) ........................ 10-2016-0143222

(51) Int. Cl.
*G09G 3/20* (2006.01)
*G02B 3/00* (2006.01)
*H01L 27/12* (2006.01)

(52) U.S. Cl.
CPC ............ *G09G 3/2092* (2013.01); *G02B 3/005* (2013.01); *G02B 3/0031* (2013.01); *G09G 3/20* (2013.01); *H01L 27/124* (2013.01); *G09G 2300/0443* (2013.01); *G09G 2310/0267* (2013.01); *G09G 2310/0297* (2013.01); *G09G 2320/028* (2013.01)

(58) Field of Classification Search
CPC ................... G09G 3/2092; G09G 3/20; G09G 2310/0297; G09G 2310/0267; G09G 2300/0443; G09G 2320/028; H01L 27/124; G02B 3/005; G02B 3/0031
See application file for complete search history.

(56) References Cited

U.S. PATENT DOCUMENTS

2007/0146261 A1* 6/2007 Matsushima ........ G09G 3/3688
345/87
2016/0234487 A1* 8/2016 Kroon .................. H04N 13/317

* cited by examiner

*Primary Examiner* — Abhishek Sarma
(74) *Attorney, Agent, or Firm* — Birch, Stewart, Kolasch & Birch, LLP

(57) ABSTRACT

A display device capable of actively controlling a viewing angle by an electrical signal, and a method for driving the same, are discussed. The display device in one embodiment includes a first substrate with a plurality of pixels, and a second substrate with convex lens, the second substrate facing the first substrate. Each of the plurality of pixels includes a main pixel and a viewing angle control pixel, and an image is displayed on both the main pixel and the viewing angle control pixel in a wide viewing angle mode. Further, an image is displayed on the main pixel, and a black is displayed on the viewing angle control pixel in a narrow viewing angle mode.

14 Claims, 12 Drawing Sheets

DISPLAY DEVICE CAPABLE OF CONTROLLING VIEWING ANGLE AND METHOD FOR DRIVING THE SAME

CROSS REFERENCE TO RELATED APPLICATIONS

This application claims the priority benefit of the Korean Patent Application No. 10-2016-0143222 filed on Oct. 31, 2016, which is hereby incorporated by reference as if fully set forth herein.

BACKGROUND

Field of the Disclosure

Embodiments of the present invention relate to a display device and a method for driving the same.

Discussion of the Related Art

With the advancement of an information-oriented society, various requirements for the display device of displaying an image are increasing. Thus, there are various display devices of liquid crystal display (LCD) devices, plasma display panel (PDP) devices, organic light emitting display (OLED) devices, etc.

Recently, the display device is applied to personal display devices such as a mobile terminal, a notebook computer, a tablet computer, and a smart watch. The personal display device may control a viewing angle in accordance with a user's need. The personal display device may be driven in a narrow viewing angle mode and a wide viewing angle mode. In case of the narrow viewing angle mode, a display image can be viewed only from the front, that is, the display image is not visible above a predetermined viewing angle. Meanwhile, in case of the wide viewing angle mode, a display image can be viewed not only from the front but also above a predetermined viewing angle. Herein, a viewing angle indicates a maximum angle at which a display image can be seen by a user with respect to the front of the display device. For example, as shown in FIG. 1, in case of a display device having a viewing angle of 80°, a display image can be seen by a user positioned at an angle of 80° in the left or right side with respect to 0° corresponding to the front of the display device.

Generally, the narrow viewing angle mode and the wide viewing angle mode of the personal display device may be realized by forming an additional viewing angle control pixel, or by detachably providing a privacy film from 3M company.

The method for forming the additional viewing angle control pixel may be realized by additionally disposing the viewing angle control pixel between each of pixels having a wide viewing angle in a display panel. The viewing angle control pixel may be an electrically controlled birefringence (EBC) pixel. In this case, an image is displayed by the use of general pixels in the wide viewing angle mode, and an image is displayed by the use of ECB pixel under the condition that the general pixels are driven with a relatively low luminance in the narrow viewing angle mode, to thereby realize both the narrow viewing angle mode and the wide viewing angle mode. However, in case of the method for forming the additional viewing angle control pixel, it is difficult to realize the narrow viewing angle in the narrow viewing angle mode.

In case of the method for detachably providing the privacy film, it is difficult to actively control the viewing angle by electrical signals. That is, a user has to selectively attach or detach the privacy film, which causes a user's inconvenience.

SUMMARY

Accordingly, embodiments of the present invention are directed to a display device that substantially obviates one or more problems due to limitations and disadvantages of the related art, and a method for driving the same.

An aspect of embodiments of the present invention is directed to provide a display device capable of actively controlling a viewing angle by an electrical signal, and a method for driving the same.

Additional advantages and features of embodiments of the invention will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of embodiments of the invention, as embodied and broadly described herein, there is provided a display device that may include a first substrate with a plurality of pixels, and a second substrate with convex lens, the second substrate facing the first substrate, wherein each of the plurality of pixels includes a main pixel and a viewing angle control pixel, and an image is displayed on both the main pixel and the viewing angle control pixel in a wide viewing angle mode, and an image is displayed on the main pixel, and a black is displayed on the viewing angle control pixel in a narrow viewing angle mode.

In another aspect of an embodiment of the present invention, there is provided a method for driving a display device comprising a first substrate with a plurality of pixels, each including a main pixel and a viewing angle control pixel, and a second substrate with convex lens, the second substrate facing the first substrate, the method including: displaying an image on the main pixel and the viewing angle control pixel in a wide viewing angle mode; and displaying an image on the main pixel and displaying a black on the viewing angle control pixel in a narrow viewing angle mode.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
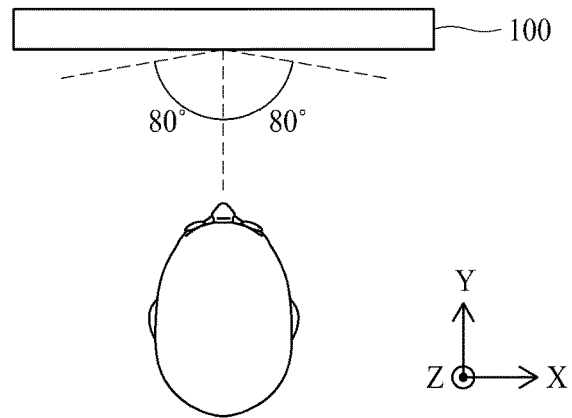
FIG. 1 is an exemplary view for explaining a viewing angle.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted.

In a case where 'comprise', 'have', and 'include' described in the present specification are used, another part may be added unless 'only~' is used. The terms of a singular form may include plural forms unless referred to the contrary. The term 'may' includes the meaning of the term 'can'.

In construing an element, the element is construed as including an error region although there is no explicit description.

In describing a position relationship, for example, when the positional order is described as 'on~', 'above~', 'below~', and 'next~', a case which is not contact may be included unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Also, "X-axis direction", "Y-axis direction", and "Z-axis direction" are not limited to a perpendicular geometric configuration. That is, "X-axis direction", "Y-axis direction", and "Z-axis direction may include an applicable wide range of a functional configuration.

Also, it should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, a display device according to the embodiment of the present invention and a method for driving the same will be described with reference to the accompanying drawings.

Figure 2:
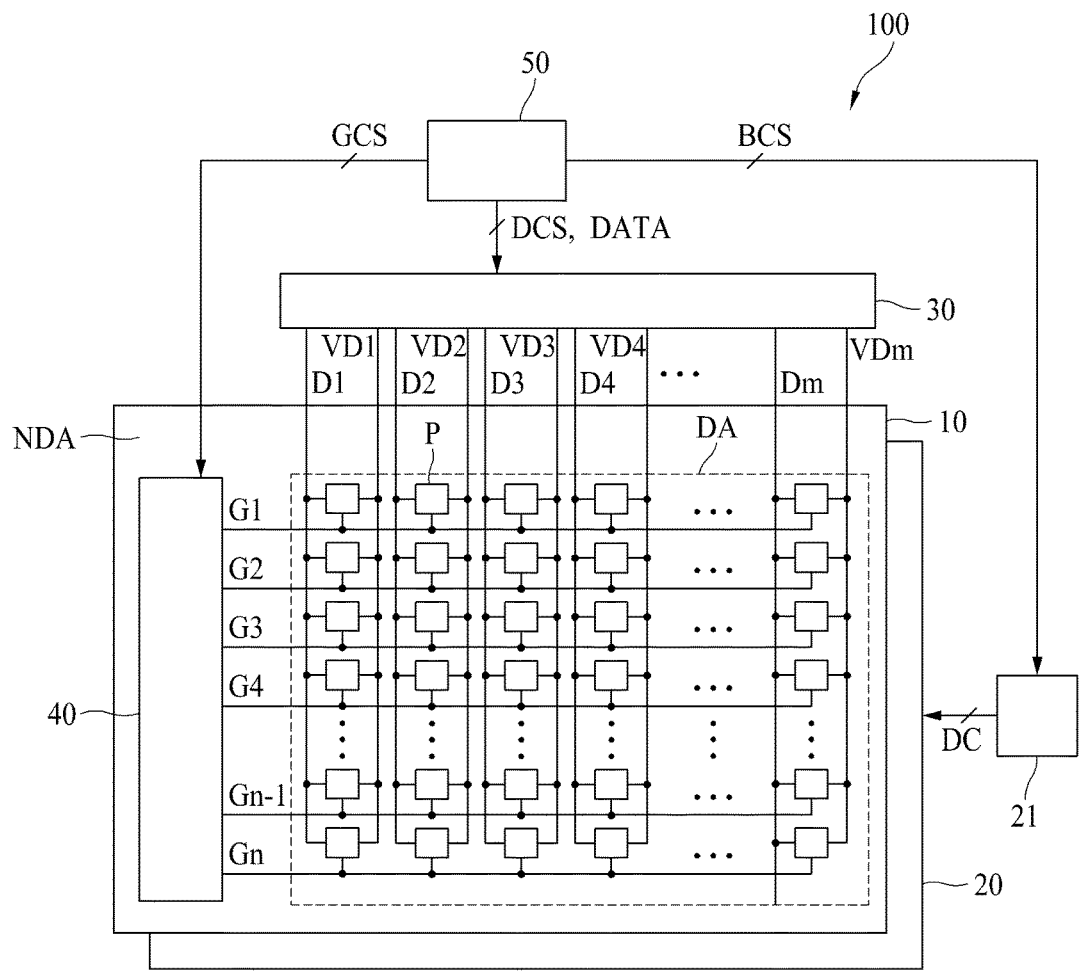
FIG. 2 is a block diagram illustrating a display device according to one embodiment of the present invention.
Figure 3:
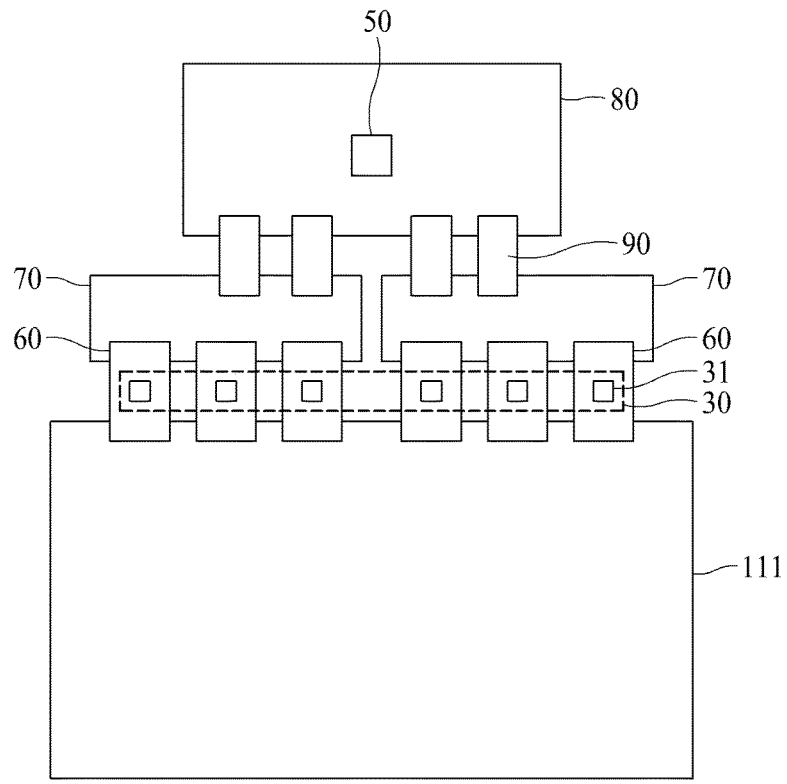
FIG. 3 is an exemplary view illustrating a first substrate, source drive ICs, a timing controller, source flexible films, a source circuit board, and a control circuit board in the display device according to one embodiment of the present invention.
Figure 4:
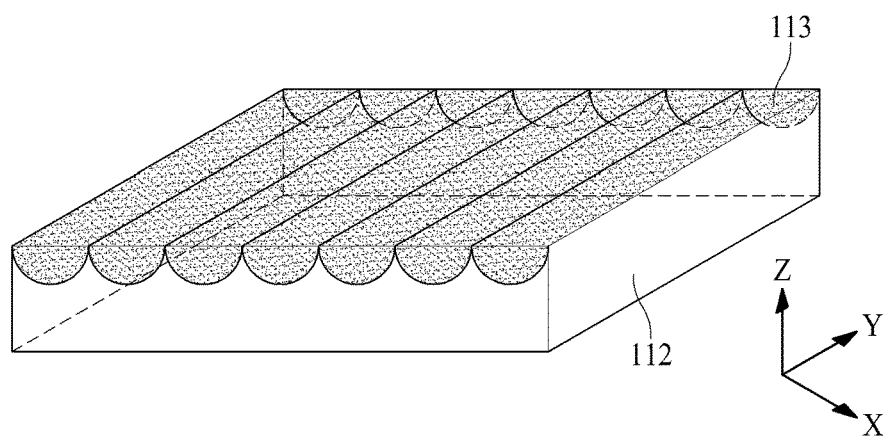
FIG. 4 is a perspective view illustrating a second substrate of a display panel according to an embodiment of the present invention.

FIG. 2 is a block diagram illustrating a display device according to one embodiment of the present invention. FIG. 3 is an exemplary view illustrating a first substrate, source drive ICs, a timing controller, source flexible films, a source circuit board, and a control circuit board in the display device according to one embodiment of the present invention. FIG. 4 is a perspective view illustrating a second substrate of a display panel. All the components of the display device according to all embodiments of the present invention are operatively coupled and configured.

In FIGS. 2 and 3, a display device 100 according to the embodiment of the present invention may be any display device capable of supplying data voltages to pixels in a line scanning method for supplying gate signals to gate lines (G1~Gn). For example, the display device 100 according to the embodiment of the present invention may be any one among a liquid crystal display device, an organic light emitting display device, a field emission display device, and an electrophoresist display device. Herein, the display device 100 according to the embodiment of the present invention is embodied in the liquid crystal display device, but not limited to this type.

Referring to FIGS. 2 to 4, the display device 100 according to the embodiment of the present invention may include a display panel 10, a backlight unit 20, a data driver 30, a gate driver 40, a timing controller 50, source flexible films 60, a source circuit board 70, a flexible circuit board 80, and a control circuit board 90.

The display panel 10 displays an image by the use of pixels. The display panel 10 may include a first substrate 111, a second substrate 112, and a liquid crystal layer interposed between the first and second substrates 111 and 112.

Figure 7A:
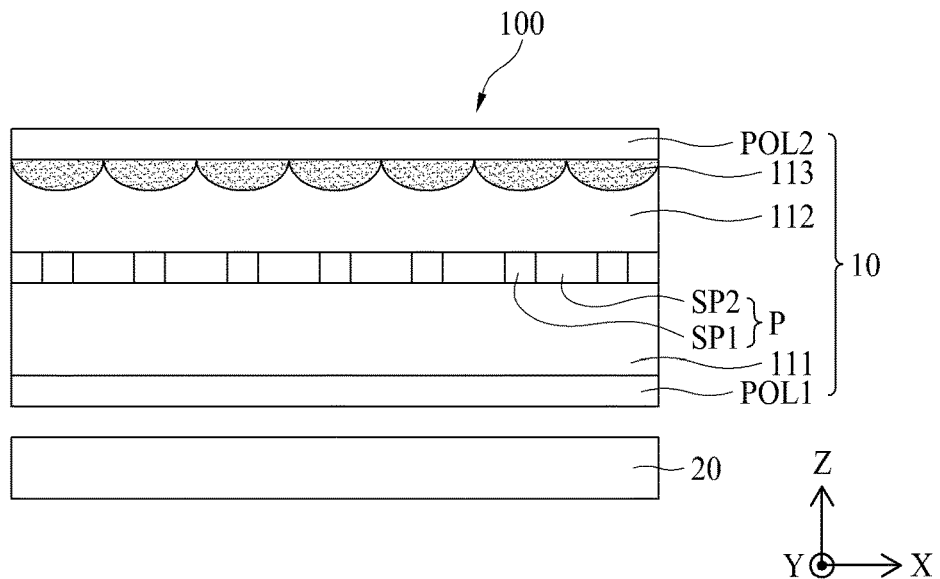
FIGS. 7A and 7B are exemplary views illustrating both wide viewing angle mode and narrow viewing angle mode in the display device according to one embodiment of the present invention.
Figure 7B:
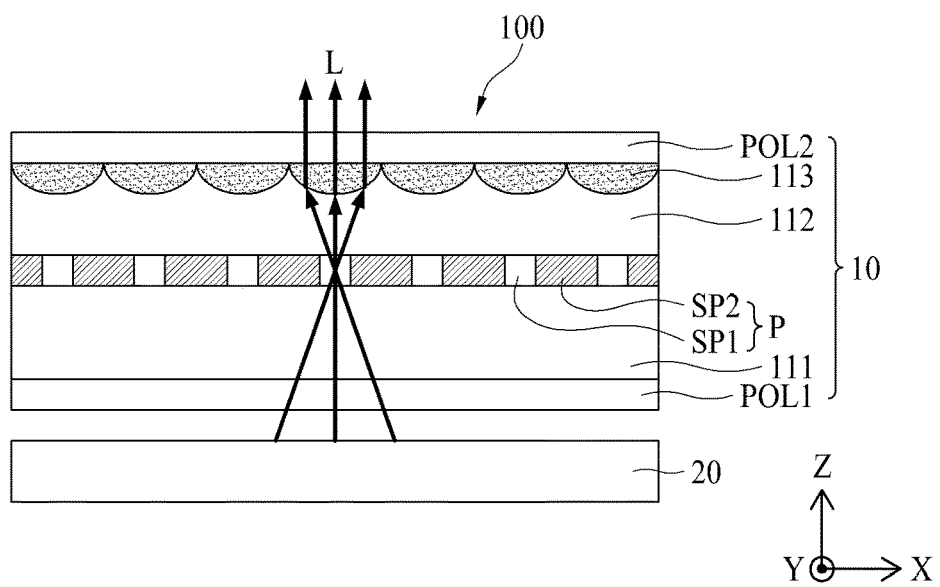
Figure 9A:
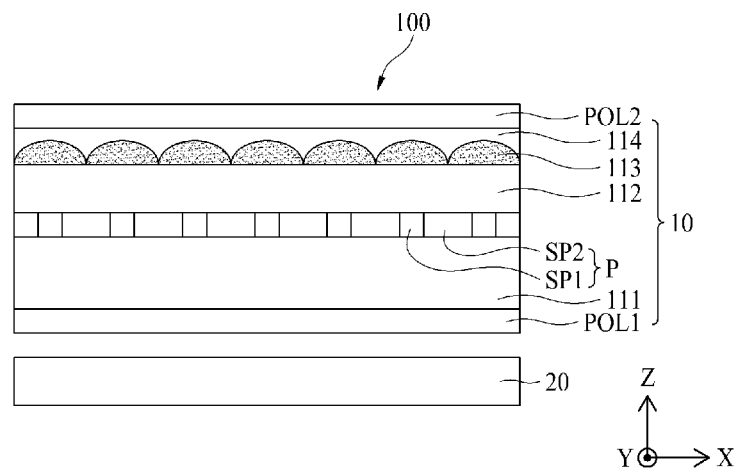
FIGS. 9A and 9B are exemplary views illustrating both wide viewing angle mode and narrow viewing angle mode in a display device according to another embodiment of the present invention.
Figure 9B:
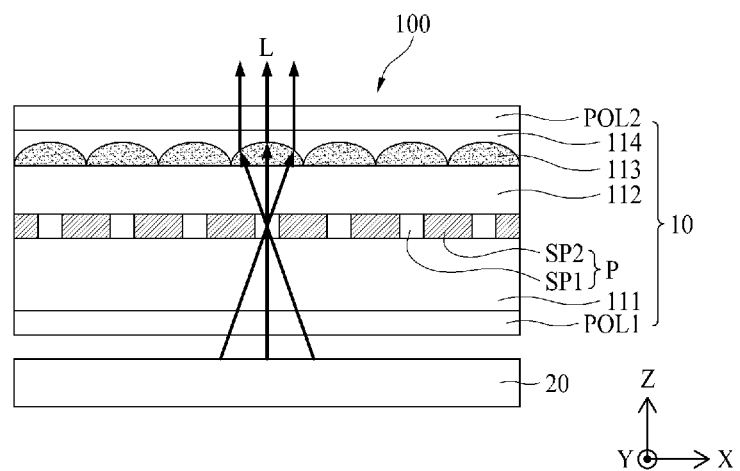

The first and second substrates 111 and 112 may be formed of glass. On a first surface of the second substrate 112, convex lens (CV) 113 may be prepared, as shown in FIG. 4. The first surface of the second substrate 112 may be one surface facing the first substrate 111, as shown in FIGS. 9A and 9B, or may be its opposite surface, as shown in FIGS. 7A and 7B.

The convex lens 113 may be obtained by forming intaglio patterns with the shape corresponding to the convex lens shape in the first surface of the second substrate 112, and filling the intaglio patterns with resin. In order to obtain the convex lens 113, a refractive index of the resin has to be higher than a refractive index of the second substrate 112. Each of the intaglio patterns may have an oval-spherical shape, as shown in FIG. 4.

Also, each pitch (PIT) of the convex lens (CV) 113 may be disposed in an X-axis direction, and a light axis (optical axis) may be disposed in a Y-axis direction. The X-axis direction may be a gate line direction, and the Y-axis direction may be a data line direction. A method for forming the convex lens (CV) on the second substrate 112 may be explained in detail with reference to FIG. 12 and FIGS. 13A to 13E.

On the first substrate 111 of the display panel 10, there are data lines (D1~Dm, where 'm' is an integer of 2 or more than 2), viewing angle data lines (VD1~VDm), and gate lines (G1~Gn, where 'n' is an integer of 2 or more than 2). The data lines (D1~Dm) and the viewing angle data lines (VD1~VDm) may be parallel to each other. The data lines (D1~Dm) and the viewing angle data lines (VD1~VDm) may cross to the gate lines (G1~Gn).

As shown in FIG. 2, pixels (P) may be provided at intersections of the data lines (D1~Dm), the viewing angle data lines (VD1~VDm), and the gate lines (G1~Gn). Each of the pixels (P) may be connected with the data lines (D1~Dm), the viewing angle data lines (VD1~VDm), and the gate lines (G1~Gn).

Figure 5:
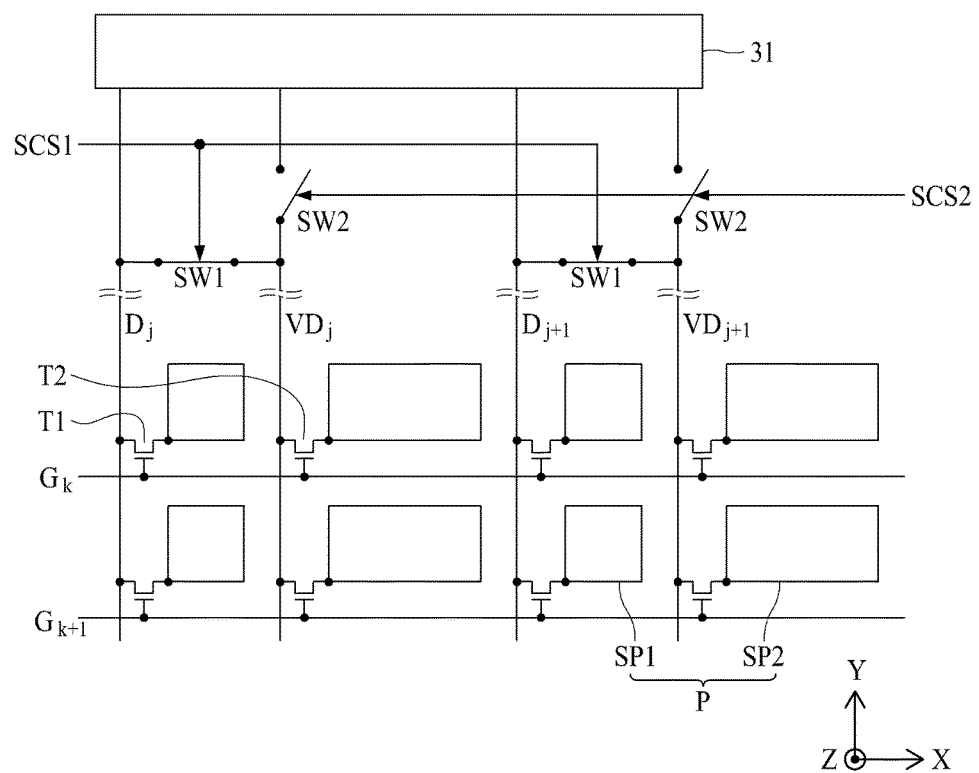
FIG. 5 is a plane view illustrating pixels in a wide viewing angle mode according to an embodiment of the present invention.
Figure 6:
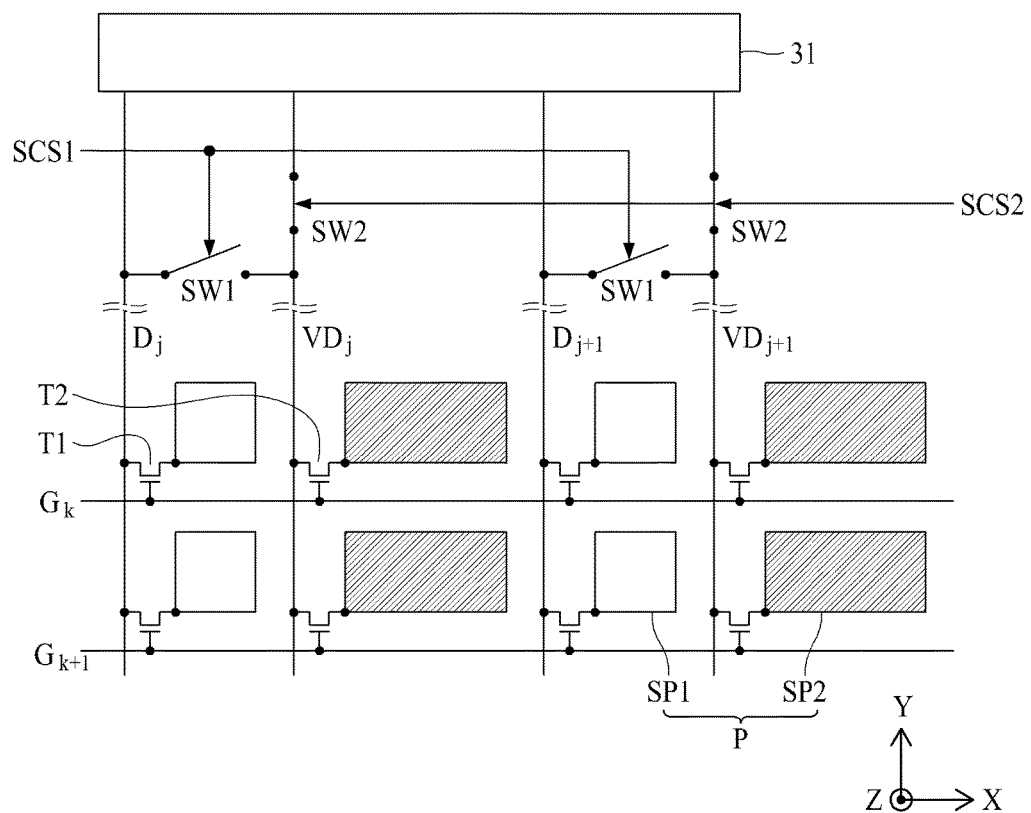
FIG. 6 is a plane view illustrating pixels in a narrow viewing angle mode according to an embodiment of the present invention.

As shown in FIGS. 5 and 6, each of the pixels (P) may include a main pixel (SP1), and a viewing angle control pixel (SP2). Each of the main pixel (SP1) and the viewing angle control pixel (SP2) may include a pixel electrode, a common electrode, and a storage capacitor.

Each of the main pixel (SP1) and the viewing angle control pixel (SP2) may be connected with any one of the gate lines (G1~Gn) and any one of the data lines (D1~Dm) through a transistor. That is, if the transistor (T) is turned-on by a gate signal of the gate line, a data voltage of the data line is supplied to the pixel electrode in each of the main pixel (SP1) and the viewing angle control pixel (SP2). Each of the main pixel (SP1) and the viewing angle control pixel (SP2) drives liquid crystal of the liquid crystal layer by an electric field generated by a voltage difference between the data voltage supplied to the pixel electrode and a common voltage supplied to the common electrode so that it is possible to adjust a transmittance of light provided from the backlight unit 20.

The common electrode may be formed on the second substrate 112 in a vertical electric field driving method such as twisted nematic (TN) mode or vertical alignment (VA) mode, or the common electrode together with the pixel electrode may be formed on the first substrate 111 in a horizontal electric field driving method such as in-plane-switching (IPS) mode or fringe field switching (FFS) mode. A liquid crystal mode of the display panel 100 may be embodied in any other type of liquid crystal mode as well as the aforementioned TN mode, VA mode, IPS mode, and FFS mode.

Also, the storage capacitor is prepared between the pixel electrode and the common electrode, wherein the storage capacitor maintains the uniform voltage difference between the pixel electrode and the common electrode. An operation of each of the main pixel (SP1) and the viewing angle control pixel (SP2) will be described in detail with reference to FIGS. 5 and 6.

On the second substrate 112 of the display panel 10, there are a black matrix and color filters. The color filters may be formed in openings which are not covered by the black matrix. If the display panel is formed in a color filter on TFT (COT) structure, the black matrix and the color filters may be formed on the first substrate 111 of the display panel 10.

A polarizing plate may be attached to each of the first and second substrates 111 and 112 of the display panel 10, and an alignment film for setting a pre-tilt angle of the liquid crystal may be provided. A color space for maintaining a cell gap of the liquid crystal layer may be provided between the first and second substrates 111 and 112 of the display panel 10.

The display panel 10 may be a transmission type liquid crystal display panel which modulates the light emitted from the backlight unit 20. The backlight unit 20 may include a light source which emits light in accordance with a driving current (DC) supplied from a backlight driver 21, a light guiding plate (or diffusion plate), and a plurality of optical sheets. The backlight unit 20 may be categorized into a direct type and an edge type. The light sources of the backlight unit 20 may be selected from one kind or two or more kinds among a hot cathode fluorescent lamp (HCFL), a cold cathode fluorescent lamp (CCFL), an external electrode fluorescent lamp, a light emitting diode (LED), and an organic light emitting diode (OLED).

The backlight driver 21 generates the driving current (DC) for driving the light sources of the backlight unit 20. The backlight driver 21 turns on/off the driving current (DC) supplied to the light sources under the control of backlight controller. The backlight controller transmits backlight control data (BCD) including a duty ratio adjusting value of a pulse width modulation (PWM) signal to the backlight driver 21 in accordance with a global/local dimming signal which is provided from a host system or the timing controller 50. In FIG. 2, the backlight controller is provided inside the timing controller 50.

The data driver 30 receives digital video data (DATA) and data control signal (DCS) from the timing controller 50. The data driver 30 receives gamma reference voltages from a gamma reference voltage supplier.

The data driver 30 may include at least one source drive IC 31. The source drive IC 31 generates gamma grayscale voltages by dividing the gamma reference voltages. The source drive IC 31 converts the digital video data (DATA) into analog data voltages by the use of gamma grayscale voltages in accordance with the data control signal (DCS). The source drive IC 31 supplies the analog data voltages to the data lines (D1~Dm). Also, the source drive IC 31 supplies data voltages of black grayscale to the viewing angle data lines (VD1~VDm).

Each of the source drive ICs 31 may be manufactured in a driving chip. Each of the source drive ICs 31 may be mounded on the source flexible film 60. Each of the source flexible films 60 may be formed of a tape carrier package or chip on film, which may be bent or curved. Each of the source flexible films 60 may be attached to a non-display area of the display panel 10 by a TAB method using an anisotropic conductive film, whereby the source drive ICs 31 may be connected with the data lines (D1~Dm).

Each of the source drive ICs 31 may be directly attached onto the first substrate 111 by a chip on glass (COG) method or chip on plastic (COP) method, and then connected with the data lines (D1~Dm).

The source flexible films 60 may be attached onto the source circuit board 70. The source circuit board 70 may be a flexible printed circuit board capable of being bent or curved. Herein, it is possible to provide one source circuit board 70, or to provide the plurality of source circuit boards 70.

The gate driver 40 receives a gate control signal (GCS) from the timing controller 50. The gate driver 40 generates the gate signals which are swung from a gate low voltage (VGL) to a gate high voltage (VGH) in accordance with the gate control signal (GCS), and supplies the generated gate signals to the gate lines (G1~Gn). The gate high voltage turns on the transistors of the pixels (P) of the display panel 10, and the gate low voltage turns off the transistors of the pixels (P) of the display panel 10.

The gate driver 40 may be disposed in the non-display area (NDA) by a gate driver in panel (GIP) method. In FIG. 2, the gate driver 40 is disposed in the non-display area (NDA) at one peripheral side of a display area (DA), but not limited to this structure. For example, the gate driver 40 may be disposed in the non-display area (NDA) at both peripheral sides of the display area (DA).

The gate driver 40 may include a plurality of gate drive integrated circuits (gate drive ICs). The gate drive ICs may be mounted on gate flexible films. Each of the gate flexible films may be a tape carrier package or chip on film. Each of the gate flexible films may be attached to the non-display area (NDA) of the display panel 10 by a TAB method using an anisotropic conductive film, whereby the gate drive ICs may be connected with the gate lines (G1~Gn).

The timing controller 50 receives video data (DATA) and timing signals (TS) from an external system board. The timing signals may include a vertical synchronization signal, a horizontal synchronization signal, a data enable signal, a dot clock, and etc.

The timing controller 50 generates the gate control signal (GCS) for controlling an operation timing of the gate driver 40, and generates the data control signal (DCS) for controlling an operation timing of the data driver 30 on the basis of driving timing information stored in a memory such as an electrically erasable programmable read-only memory (EEPROM). The timing controller 50 supplies the gate control signal (GCS) to the gate driver 40, and the timing controller 50 supplies the video data (DATA) and the data control signal (DCS) to the data driver 30.

The timing controller 50 may be mounted on the control circuit board 90, as shown in FIG. 2. The control circuit board 90 and the source circuit board 70 may be connected through the flexible circuit board 80 such as a flexible flat cable (FFC) or a flexible printed circuit (FPC), but not limited to this structure. If the liquid crystal display device is applied to a small-sized display device such as a mobile device, the timing controller 50 may be mounted on the source circuit board 70. In this case, it is possible to omit the control circuit board 90 and the flexible circuit board 80.

FIG. 5 is a plane view illustrating pixels in a wide viewing angle mode, and FIG. 6 is a plane view illustrating pixels in a narrow viewing angle mode.

For convenience of explanation, FIGS. 5 and 6 show only the kth gate line and the k+1th gate line (Gk, Gk+1, where 'k' is an integer satisfying 1≤k≤n), the jth data line and the j+1th data line (DJ, Dj+1, where 'j' is an integer satisfying 1≤j≤n), the jth viewing angle data line and the j+1th viewing angle data line (VDJ, VDj+1), the pixels (P) provided at the intersection of the above gate lines, data lines, and viewing angle data lines, and first and second switches (SW1, SW2) connected with the jth data line and the j+1th data line (DJ, Dj+1) and the jth viewing angle data line and the j+1th viewing angle data line (VDJ, VDj+1).

Referring to FIGS. 5 and 6, each of the pixels (P) may include the main pixel (SP1) and the viewing angle control pixel (SP2). Each of the main pixel (SP1) and the viewing angle control pixel (SP2) may include the pixel electrode, the common electrode, and the storage capacitor.

The main pixel (SP1) may be connected with the kth gate line (Gk) and the jth data line (Dj) through the first transistor (T1). In detail, a gate electrode of the first transistor (T1) is connected with the kth gate line (Gk), a source electrode of the first transistor (T1) is connected with the jth data line (Dj), and a drain electrode of the first transistor (T1) is connected with the pixel electrode of the main pixel (SP1).

If the gate signal is applied to the kth gate line (Gk), the first transistor (T1) is turned-on so that the data voltage of the jth data line (Dj) is supplied to the pixel electrode of the main pixel (SP1). Accordingly, the main pixel (SP1) drives the liquid crystal of the liquid crystal layer by the electric field generated in the voltage difference between the data voltage of the pixel electrode and the common voltage of the common electrode so that it is possible to adjust the transmittance of light provided from the backlight unit 20.

The viewing angle control pixel (SP2) is connected with the kth gate line (GK) and the jth viewing angle data line (VDj) through the second transistor (T2). In detail, a gate electrode of the second transistor (T2) is connected with the kth gate line (Gk), a source electrode of the second transistor (T2) is connected with the jth viewing angle data line (VDj), and a drain electrode of the second transistor (T2) is connected with the pixel electrode of the viewing angle control pixel (SP2).

If the gate signal is applied to the kth gate line (Gk), the second transistor (T2) is turned-on so that the data voltage of the jth viewing angle data line (VDj) is supplied to the pixel electrode of the viewing angle control pixel (SP2). Accordingly, the viewing angle control pixel (SP2) drives the liquid crystal of the liquid crystal layer by the electric field generated in the voltage difference between the data voltage of the pixel electrode and the common voltage of the common electrode so that it is possible to adjust the transmittance of light provided from the backlight unit 20.

The viewing angle control pixel (SP2) is relatively larger than the main pixel (SP1). For example, as shown in FIGS. 5 and 6, the viewing angle control pixel (SP2) is relatively longer than the main pixel (SP1) in the X-axis direction, wherein the X-axis direction indicates the gate line direction.

The first switch (SW1) is disposed between the jth data line (Dj) and the jth viewing angle data line (VDj), to thereby switch a connection between the jth data line (Dj) and the jth viewing angle data line (VDj). The first switch (SW1) is turned-on/off by a first switching control signal (SCS1). For example, the first switch (SW1) is turned-on by the first switch control signal (SCS1) with a first logic level voltage, and is turned-off by the first switching control signal (SCS1) with a second logic level voltage.

The second switch (SW2) is disposed between the jth viewing angle data line (VDj) and the source drive IC 31, to thereby switch a contact between the jth viewing angle data line (VDj) and the source drive IC 31. The second switch (SW2) is turned-on/off by a second switching control signal (SCS2). For example, the second switch (SW2) is turned-on by the second switch control signal (SCS2) with a first logic level voltage, and is turned-off by the second switching control signal (SCS2) with a second logic level voltage.

The display device according to the embodiment of the present invention may be driven in the wide viewing angle mode or narrow viewing angle mode. In case of the narrow viewing angle mode, a display image can be viewed only from the front, that is, the display image is not visible above a predetermined viewing angle. Meanwhile, in case of the wide viewing angle mode, a display image can be viewed not only from the front but also above a predetermined viewing angle. The first and second switch control signals (SCS1, SCS2) may be generated in the timing controller 50 according to whether it is driven in the wide viewing angle mode or narrow viewing angle mode.

The viewing angle indicates a maximum angle at which a display image can be seen by a user with respect to the front of the display device. For example, as shown in FIG. 1, in case of the display device having the viewing angle of 80°, a display image can be seen by a user positioned at an angle of 80° in the left or right side with respect to 0° corresponding to the front of the display device.

In detail, in case of the wide viewing angle mode, as shown in FIG. 5, the first switch (SW1) is turned-on by the first switch control signal (SCS1) of the first logic level voltage, and the second switch (SW2) is turned-off by the second switch control signal (SCS2) of the second logic level voltage. In the wide viewing angle mode, the jth data line (Dj) and the jth viewing angle data line (VDj) are connected with each other, and the jth viewing angle data line (VDj) and the source drive IC 31 are not connected with each other. Accordingly, the same data voltage is supplied to the jth data line (Dj) and the jth viewing angle data line (VDj). Thus, in case of the wide viewing angle mode, the same data voltage is supplied to the main pixel (SP1) and the viewing angle control pixel (SP2), whereby an image may be displayed by the use of main pixel (SP1) and viewing angle control pixel (SP2).

Meanwhile, in case of the narrow viewing angle mode, as shown in FIG. 6, the first switch (SW1) is turned-off by the first switch control signal (SCS1) of the second logic level voltage, and the second switch (SW2) is turned-on by the second switch control signal (SCS2) of the first logic level voltage. In the narrow viewing angle mode, the jth data line (Dj) and the jth viewing angle data line (VDj) are not connected with each other, and the jth viewing angle data line (VDj) and the source drive IC 31 are connected with each other. Accordingly, the data voltage is supplied to the jth data line (Dj), and the data voltage of black grayscale is supplied to the jth viewing angle data line (VDj). Thus, in case of the narrow viewing angle mode, the data voltage of black grayscale is supplied to the viewing angle control pixel (SP2), whereby an image may be displayed only in the main pixel (SP1).

As described above, in case of the wide viewing angle mode, the same data voltage is supplied to the main pixel (SP1) and the viewing angle control pixel (SP2), whereby an image may be displayed by the use of main pixel (SP1) and viewing angle control pixel (SP2), to thereby realize the wide viewing angle. Also, in case of the narrow viewing angle mode, the data voltage of black grayscale is supplied to the viewing angle control pixel (SP2), whereby an image may be displayed in the main pixel (SP1), and a black is displayed in the viewing angle control pixel (SP2), to thereby realize the narrow viewing angle. That is, it is possible to control the wide viewing angle mode and the narrow viewing angle mode in accordance with an applied electrical signal.

FIGS. 7A and 7B are exemplary views illustrating both the wide viewing angle mode and narrow viewing angle mode in the display device according to one embodiment of the present invention. FIG. 7A illustrates the display device 100 according to the wide viewing angle mode, and FIG. 7B illustrates the display device 100 according to the narrow viewing angle mode.

For convenience of explanation, FIGS. 7A and 7B show only the first substrate 111 and the second substrate 112 of the display panel 10, the pixels (P) on the first surface of the first substrate 111, the first polarizing plate (POL1) attached to the second surface of the first substrate 111, the second polarizing plate (POL2) attached to the first surface of the second substrate 112, and the backlight unit 200. In FIGS. 7A and 7B, the convex lenses 113 are prepared on the first surface of the second substrate 112, wherein the first surface of the second substrate 112 corresponds to the surface which is opposite to one surface facing the first substrate 111.

Referring to FIGS. 7A and 7B, the viewing angle control pixel (SP2) is relatively larger than the main pixel (SP1). For example, as shown in FIGS. 7A and 7B, the viewing angle control pixel (SP2) is longer than the main pixel (SP1) in the X-axis direction, wherein the X-axis direction indicates the gate line direction. In FIGS. 7A and 7B, a ratio of a size of the main pixel (SP1) to a size of the viewing angle control pixel (SP2) is 1:2, but not limited to this structure. For example, the size of the main pixel (SP1) and the size of the viewing angle control pixel (SP2) may be changed in accordance with a focal distance of the convex lens 113.

In case of the wide viewing angle mode, as shown in FIG. 7A, an image is displayed on the main pixel (SP1) and the viewing angle control pixel (SP2) in each of the pixels (P), whereby the light emitted from the main pixel (SP1) and the viewing angle control pixel (SP2) may advance toward all directions. Accordingly, a display image can be viewed not only from the front but also above a predetermined viewing angle. That is, a user can watch the display image within a predetermined viewing angle.

Meanwhile, in case of the narrow viewing angle mode, as shown in FIG. 7B, an image is displayed on the main pixel (SP1) of each pixel (P), and a black is displayed in the viewing angle control pixel (SP2). The main pixel (SP1) of each pixel (P) is disposed in the center of the convex lens 113, whereby the light emitted from the main pixel (SP1) of each pixel (P) is refracted by the convex lens 113, and the refracted light advances toward the front. Accordingly, a display image can be viewed only from the front, that is, the display image is not visible above a predetermined viewing angle.

According to the embodiment of the present invention, as described above, the convex lenses 113 are provided on the second substrate 112, and each pixel (P) is divided into the main pixel (SP1) and the viewing angle control pixel (SP2). In the wide viewing angle mode, an image is displayed both on the main pixel (SP1) and the viewing angle control pixel (SP2) so that it is possible to realize the wide viewing angle. In the narrow viewing angle mode, an image is displayed on the main pixel (SP1), and a black is displayed on the viewing angle control pixel (SP2) so that it is possible to realize the narrow viewing angle. That is, it is possible to actively control the viewing angle in accordance with the electrical signal.

Figure 8A:
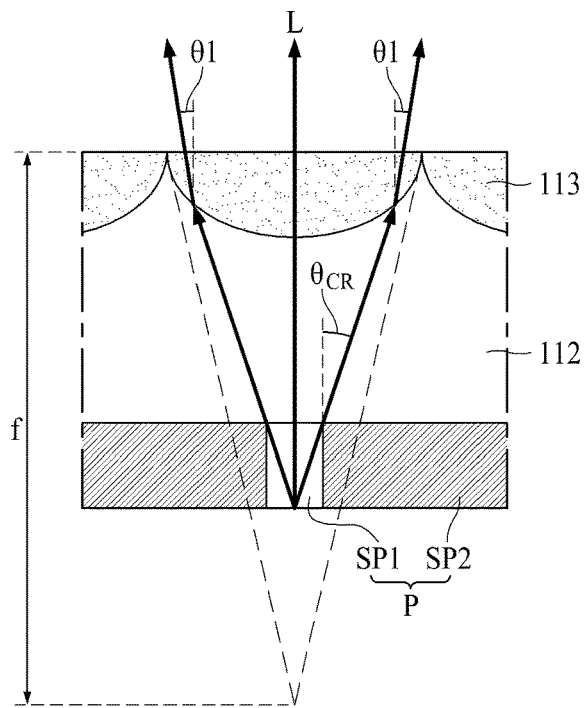
FIGS. 8A and 8B are exemplary views for explaining a method for calculating a viewing angle in the narrow viewing angle mode of the display device according to one embodiment of the present invention.
Figure 8B:
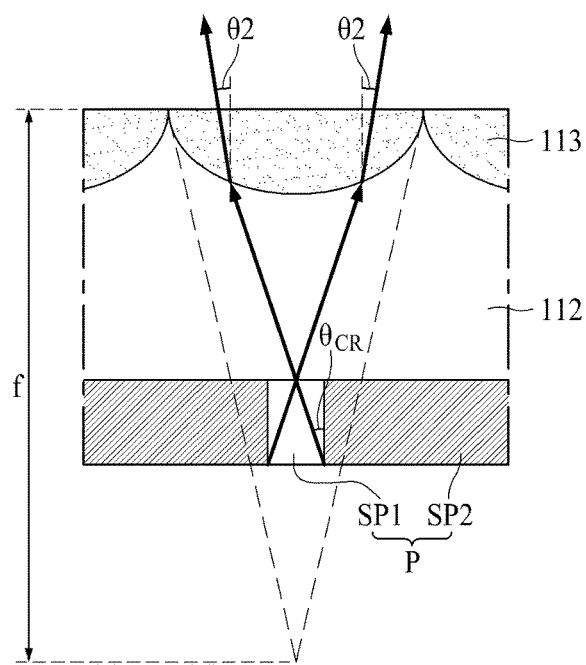

FIGS. 8A and 8B illustrate a method for calculating the viewing angle in the narrow viewing angle mode of FIG. 7B.

Referring to FIGS. 8A and 8B, a critical angle ($\theta_{CR}$) at which the light (L) emitted from the backlight unit 200 is incident on the convex lens 113 through the main pixel (SP1) may be defined by the following Equation 1.

$$\theta_{CR} = \sin^{-1}\left(\frac{n_1}{n_2}\right) \quad \text{[Equation 1]}$$

In the above Equation 1, $\theta_{CR}$ is the critical angle at which the light (L) emitted from the backlight unit 200 is incident on the main pixel (SP1), 'n1' is a refractive index of an air layer, and 'n2' is a refractive index of the second substrate 112.

The light (L) having the predetermined critical angle ($\theta_{CR}$) to be incident on the main pixel (SP1) may reach the convex lens 113 through an upper edge of the main pixel (SP1), as shown in FIG. 8A, or may reach the convex lens 113 through a lower edge of the main pixel (SP1), as shown in FIG. 8B. An angle of the light (L) refracted on the convex lens 113 through the upper edge of the main pixel (SP1), as shown in FIG. 8A, may be defined as a first viewing angle ($\theta 1$). Also, an angle of the light (L) refracted on the convex lens 113 through the lower edge of the main pixel (SP1), as shown in FIG. 8B, may be defined as a second viewing angle ($\theta 2$). In this case, a final viewing angle of the narrow viewing angle mode may be set to a maximum value selected from the first viewing angle and the second viewing angle.

FIGS. 9A and 9B are exemplary views illustrating both wide viewing angle mode and narrow viewing angle mode in a display device according to another embodiment of the present invention. FIG. 9A illustrates the display device according to another embodiment of the present invention in the wide viewing angle mode, and FIG. 9B illustrates the display device according to another embodiment of the present invention in the narrow viewing angle mode.

For convenience of explanation, FIGS. 9A and 9B show only first and second substrates 111 and 112 of a display panel 10, pixels (P) on a first surface of the first substrate 111, a first polarizing plate (POL1) attached to a second surface of the first substrate 111, a second polarizing plate (POL2) attached to a first surface of the second substrate 112, and a backlight unit 200. In FIGS. 9A and 9B, convex lenses 113 are prepared on the first surface of the second substrate 112, and the first surface of the second substrate 112 corresponds to one surface facing the first substrate 111. In this case, a gap substrate 114 for ensuring a focal distance (f) of the convex lens 113 is provided between the first substrate 111 and the second substrate 112. The gap substrate 114 may be formed of glass.

In the wide viewing angle mode, as shown in FIG. 9A, an image is displayed on a main pixel (SP1) and a viewing angle control pixel (SP2) of each pixel (P), whereby light emitted from the main pixel (SP1) and the viewing angle control pixel (SP2) may advance toward all directions. Accordingly, a display image can be viewed not only from the front but also above a predetermined viewing angle. That is, a user can watch the display image within a predetermined viewing angle.

Meanwhile, in case of the narrow viewing angle mode, as shown in FIG. 9B, an image is displayed on the main pixel (SP1) of each pixel (P), and a black is displayed in the viewing angle control pixel (SP2). The light (L) emitted from the main pixel (SP1) of each pixel (P) is refracted by the convex lens 113, and the refracted light advances toward the front. Accordingly, a display image can be viewed only from the front, that is, the display image is not visible above a predetermined viewing angle.

According to the embodiment of the present invention, as described above, the convex lenses 113 are provided on the second substrate 112, and each pixel (P) is divided into the main pixel (SP1) and the viewing angle control pixel (SP2). In the wide viewing angle mode, an image is displayed both on the main pixel (SP1) and the viewing angle control pixel (SP2) so that it is possible to realize the wide viewing angle. In the narrow viewing angle mode, an image is displayed on the main pixel (SP1), and a black is displayed on the viewing angle control pixel (SP2) so that it is possible to realize the narrow viewing angle. That is, it is possible to actively control the viewing angle in accordance with the electrical signal.

Figure 10A:
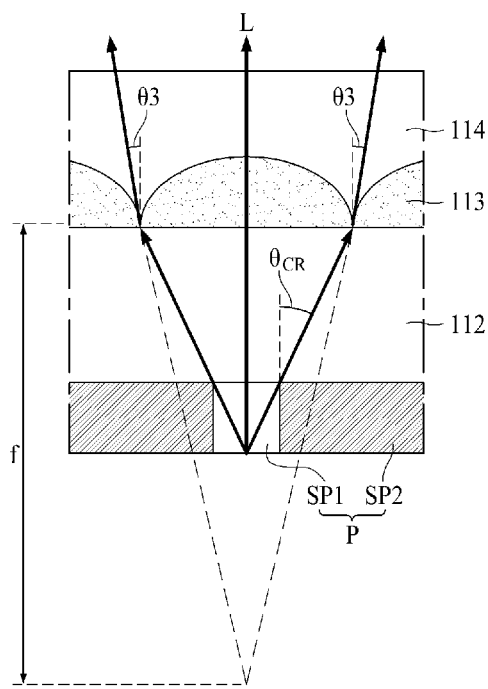
FIGS. 10A and 10B are exemplary views for explaining a method for calculating a viewing angle in the narrow viewing angle mode of the display device according to another embodiment of the present invention.
Figure 10B:
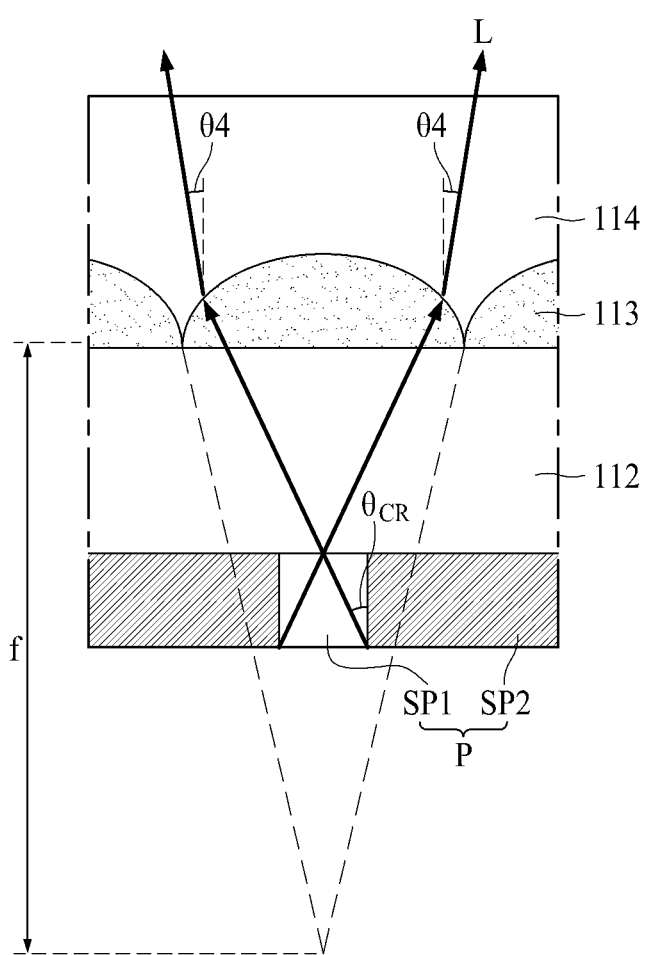

FIGS. 10A and 10B illustrate a method for calculating the viewing angle in the narrow viewing angle mode of FIG. 9B.

Referring to FIGS. 10A and 10B, the main pixel (SP1) of each pixel (P) is disposed in the center of the convex lens 113. In this case, a critical angle ($\theta_{CR}$) at which the light (L) emitted from the backlight unit 200 is incident on the convex lens 113 through the main pixel (SP1) may be defined by the above Equation 1.

The light (L) having the predetermined critical angle ($\theta_{CR}$) to be incident on the main pixel (SP1) may reach the convex lens 113 through an upper edge of the main pixel (SP1), as shown in FIG. 10A, or may reach the convex lens 113 through a lower edge of the main pixel (SP1), as shown in FIG. 10B. An angle of the light (L) refracted on the convex lens 113 through the upper edge of the main pixel (SP1), as shown in FIG. 10A, may be defined as a third viewing angle ($\theta 3$). Also, an angle of the light (L) refracted on the convex lens 113 through the lower edge of the main pixel (SP1), as shown in FIG. 10B, may be defined as a fourth viewing angle ($\theta 4$). In this case, a final viewing angle of the narrow viewing angle mode may be set to a maximum value selected from the third viewing angle and the fourth viewing angle.

Figure 11:
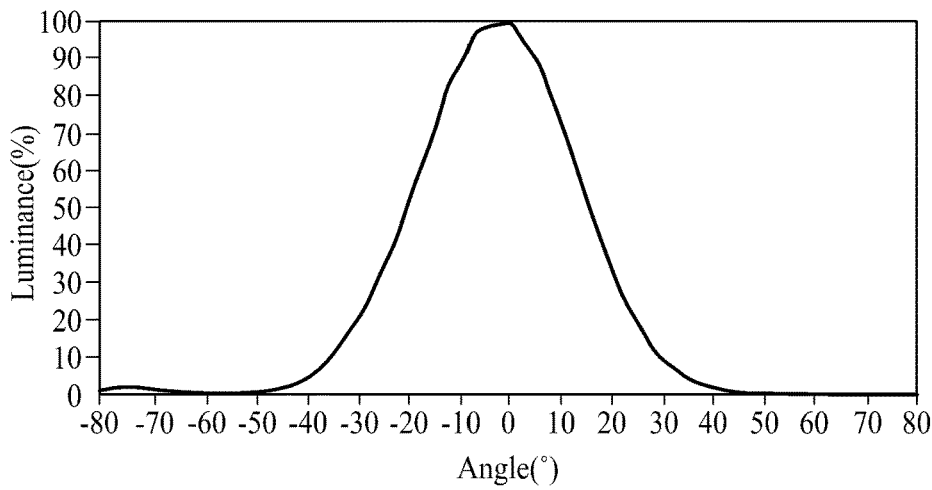
FIG. 11 is a graph illustrating a luminance in accordance with the viewing angle of the narrow viewing angle mode according to the embodiment of the present invention.

FIG. 11 is a graph illustrating a luminance in accordance with the viewing angle of the narrow viewing angle mode according to the embodiment of the present invention.

In FIG. 11, a right side of the X-axis corresponds to a right-side viewing angle, a left side of the X-axis corresponds to a left-side viewing angle, and the Y-axis corresponds to a luminance.

Referring to FIG. 11, with respect to the maximum luminance 100%, a viewing angle of the narrow viewing angle mode may be set to an angle having the luminance of 5% or more than 5%. In FIG. 11, the luminance of 5% or more than 5% may be obtained by a left-side viewing angle 38° and a right-side viewing angle 34°. Thus, according to the embodiment of the present invention, an image can be seen from the left-side viewing angle 38° and the right-side viewing angle 34°, and the image is not visible above the left-side viewing angle 38° and the right-side viewing angle 34°.

According to the embodiment of the present invention, as described above, it is possible to actively control the viewing angle by the electrical signal, and also to realize the narrow viewing angle by the left-side viewing angle 38° and the right-side viewing angle 34° in the narrow viewing angle mode.

Figure 12:
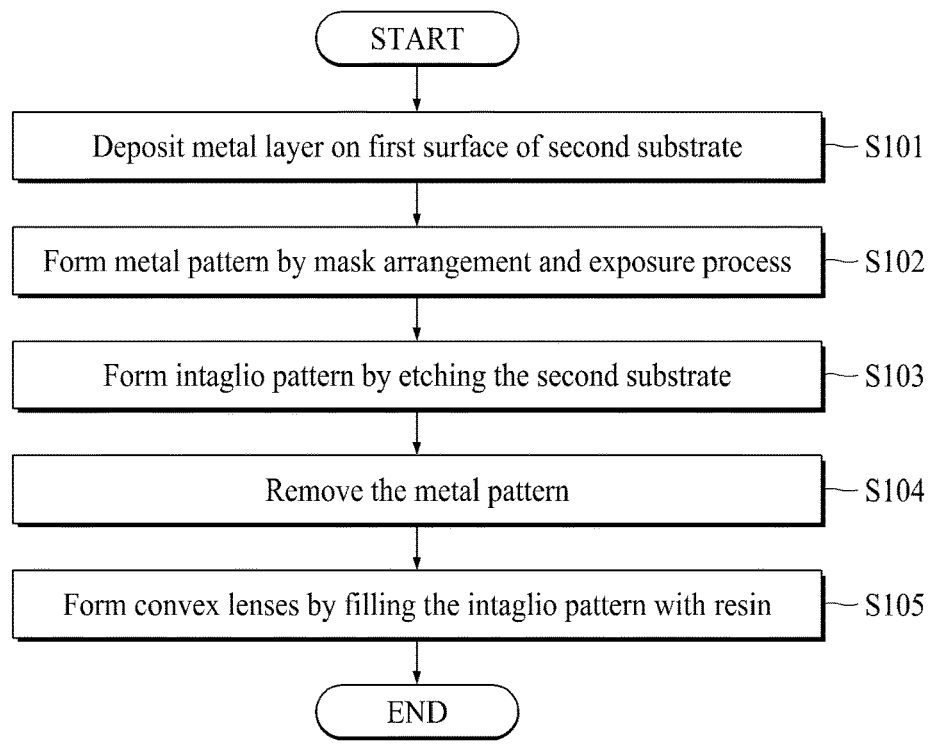
FIG. 12 is a flow chart illustrating a method for manufacturing the second substrate of the display panel according to an embodiment of the present invention.

FIG. 12 is a flow chart illustrating a method for manufacturing the second substrate of the display panel according to an embodiment of the present invention. FIGS. 13A to 13E illustrate the method for manufacturing the second substrate of the display panel.

Hereinafter, the method for manufacturing the second substrate 112 according to one embodiment of the present invention will be described in detail with reference to FIG. 12 and FIGS. 13A to 13E. In FIG. 12 and FIGS. 13A to 13E, the second substrate 112 is formed of glass.

Figure 13A:
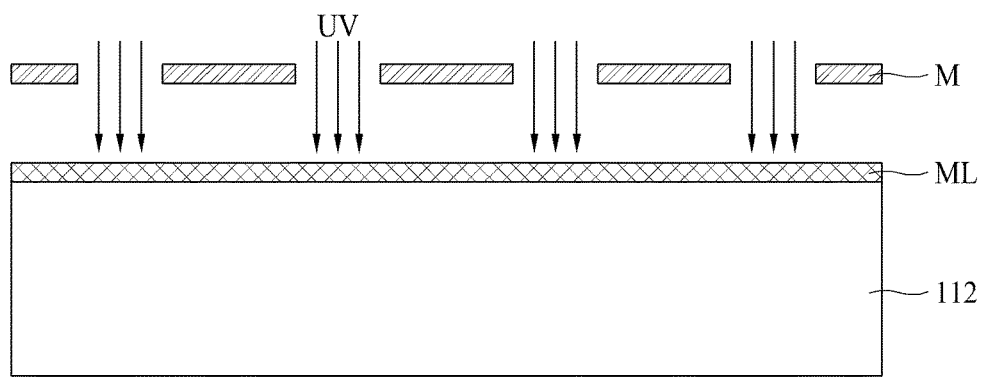
FIGS. 13A to 13E illustrate a method for manufacturing the second substrate of the display panel according to an embodiment of the present invention.

Firstly, as shown in FIG. 13A, a metal layer (ML) is deposited on the first surface of the second substrate 112. The metal layer (ML) may be formed of molybdenum (Mo), and may be deposited at a thickness of about 2000 Å, preferably. The thickness of the metal layer (ML) may be set in consideration of a thickness of each intaglio pattern 112a (See S101 of FIG. 12).

Figure 13B:
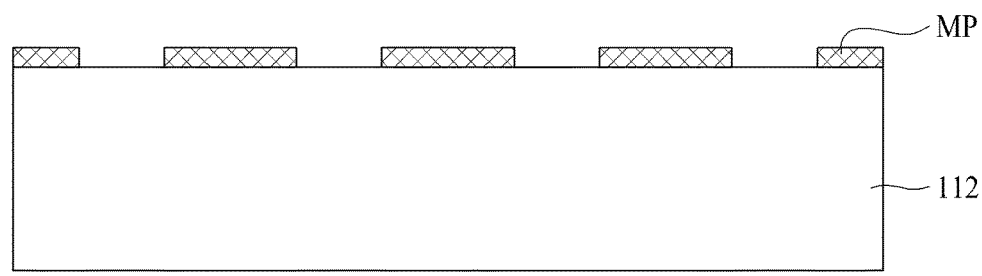

Secondly, as shown in FIG. 13B, a mask (M) is arranged on the metal layer (ML), and some areas of the metal layer (ML) are exposed by UV irradiation, to thereby form a metal pattern (MP) (See S102 of FIG. 12).

Figure 13C:
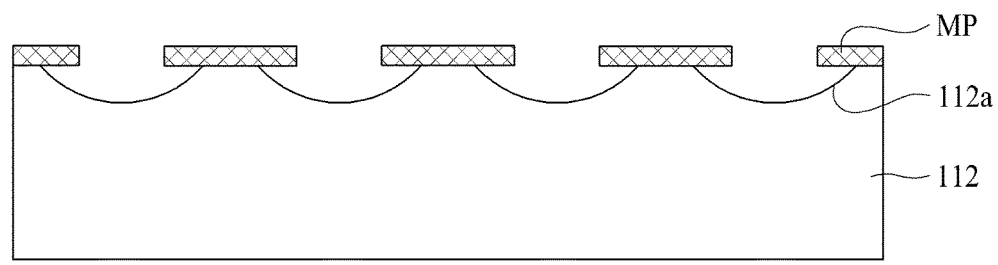

Thirdly, as shown in FIG. 13C, the second substrate 112 with the metal pattern (MP) is etched by the use of etching gas such as hydrofluoric acid (HF), whereby the intaglio patterns 112a may be formed in the first surface of the second substrate 112 without the metal pattern (MP) (See S103 of FIG. 12).

Figure 13D:
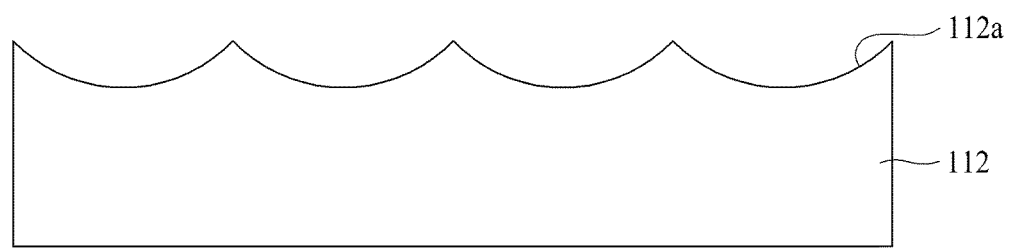

Fourthly, as shown in FIG. 13D, the metal pattern (MP) is removed from the first surface of the second substrate 112 (See S104 of FIG. 12).

Figure 13E:
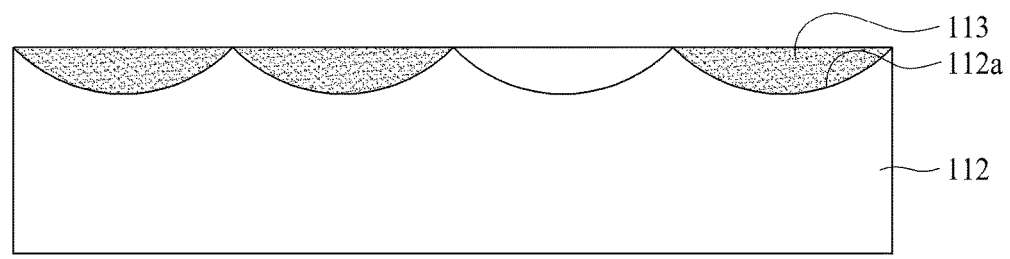

Fifthly, as shown in FIG. 13E, the convex lenses 113 are formed by filling the intaglio patterns 112 in the first surface of the second substrate 112 with resin. In order to obtain the convex lens 113, a refractive index of the resin has to be higher than a refractive index of the second substrate 112.

In order to make the shape of the convex lens 113 be a hemisphere or oval-spherical shape, an organic film may be deposited on the first surface of the second substrate 112 before filling the intaglio patterns 112a with the resin. In this case, the resin may be filled in the organic film (See S105 of FIG. 12).

Meanwhile, if the second substrate 112 is formed of a plastic substrate, the intaglio patterns 112a may be formed in the first surface of the second substrate 112 by an extrusion molding or press molding.

According to the embodiments of the present invention, the convex lenses 113 are provided on the second substrate 112, and each pixel (P) is divided into the main pixel (SP1) and the viewing angle control pixel (SP2). In the wide viewing angle mode, an image is displayed both on the main pixel (SP1) and the viewing angle control pixel (SP2) so that it is possible to realize the wide viewing angle. In the narrow viewing angle mode, an image is displayed on the main pixel (SP1), and a black is displayed on the viewing angle control pixel (SP2) so that it is possible to realize the narrow viewing angle. That is, it is possible to actively control the viewing angle in accordance with the electrical signal in the embodiments of the present invention.

It will be apparent to those skilled in the art that various modifications and variations can be made to embodiments of the present invention without departing from the spirit or scope of the invention. Thus, it is intended that the present invention covers the modifications and variations of this invention provided they come within the scope of the appended claims and their equivalents.

What is claimed is:

1. A display device comprising:
   a first substrate and a second substrate facing the first substrate;
   a plurality of pixels on the first substrate; and
   a convex lens on the second substrate,
   wherein each of the plurality of pixels includes a main pixel and a viewing angle control pixel,
   an image is displayed on both the main pixel and the viewing angle control pixel in a wide viewing angle mode, and
   an image is displayed on the main pixel, and a black is displayed on the viewing angle control pixel in a narrow viewing angle mode.

2. The display device according to claim 1, wherein the main pixel is disposed in the center of the convex lens.

3. The display device according to claim 1, wherein the convex lens includes resin filled in an intaglio pattern prepared in a first surface of the second substrate, and a refractive index of the resin is larger than a refractive index of the second substrate.

4. The display device according to claim 3, wherein the first surface of the second substrate corresponds to a surface opposite to a surface facing the first substrate.

5. The display device according to claim 3, wherein the first surface of the second substrate corresponds to a surface facing the first substrate.

6. The display device according to claim 5, further comprising a third substrate disposed between the first substrate and the second substrate.

7. The display device according to claim 1, further comprising:
   gate lines arranged in a first direction on the first substrate; and
   data lines and viewing angle data lines arranged in a second direction on the first substrate, wherein the second direction crosses the first direction.

8. The display device according to claim 7, wherein a same data voltage is supplied to the data line connected with the main pixel, and to the viewing angle data line connected with for the viewing angle control pixel in the wide viewing angle mode.

9. The display device according to claim 7, wherein an image data voltage is supplied to the data line connected with the main pixel, and a black data voltage is supplied to the viewing angle data line connected with the viewing angle control pixel in the narrow viewing angle mode.

10. The display device according to claim 7, wherein a size of the viewing angle control pixel is larger than a size of the main pixel.

11. The display device according to claim 10, wherein the viewing angle control pixel is longer than the main pixel in the first direction.

12. A method for driving a display device including a first substrate with a plurality of pixels, and a second substrate with a convex lens, each pixel including a main pixel and a viewing angle control pixel, the second substrate facing the first substrate, the method comprising:

displaying an image on the main pixel and the viewing angle control pixel in a wide viewing angle mode; and displaying an image on the main pixel and displaying a black on the viewing angle control pixel in a narrow viewing angle mode.

13. The method for driving the display device according to claim 12, wherein the displaying the image on the main pixel and the viewing angle control pixel in the wide viewing angle mode includes:

supplying a same data voltage to a data line connected with the main pixel, and to a viewing angle data line connected with the viewing angle control pixel.

14. The method for driving the display device according to claim 12, wherein the displaying the image on the main pixel and the displaying the black on the viewing angle control pixel in the narrow viewing angle mode includes:

supplying an image data voltage to the data line connected with the main pixel; and supplying a black data voltage to the viewing angle data line connected with the viewing angle control pixel.

* * * * *